US012315553B2

(12) United States Patent
Gieske et al.

(10) Patent No.: US 12,315,553 B2
(45) Date of Patent: May 27, 2025

(54) SELECTABLE ROW HAMMER MITIGATION

(71) Applicant: Micron Technology, Inc., Boise, ID (US)

(72) Inventors: Edmund J. Gieske, Cedar Park, TX (US); Sujeet Ayyapureddi, Boise, ID (US); Niccolò Izzo, Vignate (IT)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 17/973,726

(22) Filed: Oct. 26, 2022

(65) Prior Publication Data

US 2024/0038291 A1 Feb. 1, 2024

Related U.S. Application Data

(60) Provisional application No. 63/392,378, filed on Jul. 26, 2022.

(51) Int. Cl.
*G11C 16/04* (2006.01)
*G11C 11/4076* (2006.01)
*G11C 11/4078* (2006.01)
*G11C 11/4096* (2006.01)

(52) U.S. Cl.
CPC ...... *G11C 11/4078* (2013.01); *G11C 11/4076* (2013.01); *G11C 11/4096* (2013.01)

(58) Field of Classification Search
CPC ............ G11C 11/4078; G11C 11/4076; G11C 11/4096; G11C 11/408; G11C 11/40603; G06F 3/0658; G06F 3/061; G06F 3/0629; G06F 3/0683
USPC ..................................................... 365/185.04
See application file for complete search history.

(56) References Cited

U.S. PATENT DOCUMENTS 9,032,141 B2 * 5/2015 Bains .................. G06F 13/1636
711/106
11,282,561 B2 3/2022 Nale et al.
2014/0085995 A1 3/2014 Greenfield et al.
2019/0066759 A1 * 2/2019 Nale ................. G11C 11/40618

* cited by examiner

*Primary Examiner* — Tha-O H Bui
(74) *Attorney, Agent, or Firm* — Brooks, Cameron & Huebsch, PLLC

(57) ABSTRACT

An apparatus can include a number of memory devices and a controller coupled to one or more of the number of memory devices. The controller can be configured to determine whether a quantity of row activations directed to a row of the memory devices exceeds a row hammer criterion. The controller can be configured to select, responsive to determining that the row hammer criterion is met, a row hammer mitigation response from a plurality of row hammer mitigation responses available for initiation. The controller can be configured to initiate the selected row hammer mitigation response.

20 Claims, 5 Drawing Sheets

SELECTABLE ROW HAMMER MITIGATION

PRIORITY INFORMATION

This application claims the benefit of U.S. Provisional Application Ser. No. 63/392,378 filed on Jul. 26, 2022, the contents of which are incorporated herein by reference.

TECHNICAL FIELD

Embodiments of the disclosure relate generally to memory systems, and more specifically, relate to selectable row hammer mitigation within memory systems.

BACKGROUND

A computing system can include a memory system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
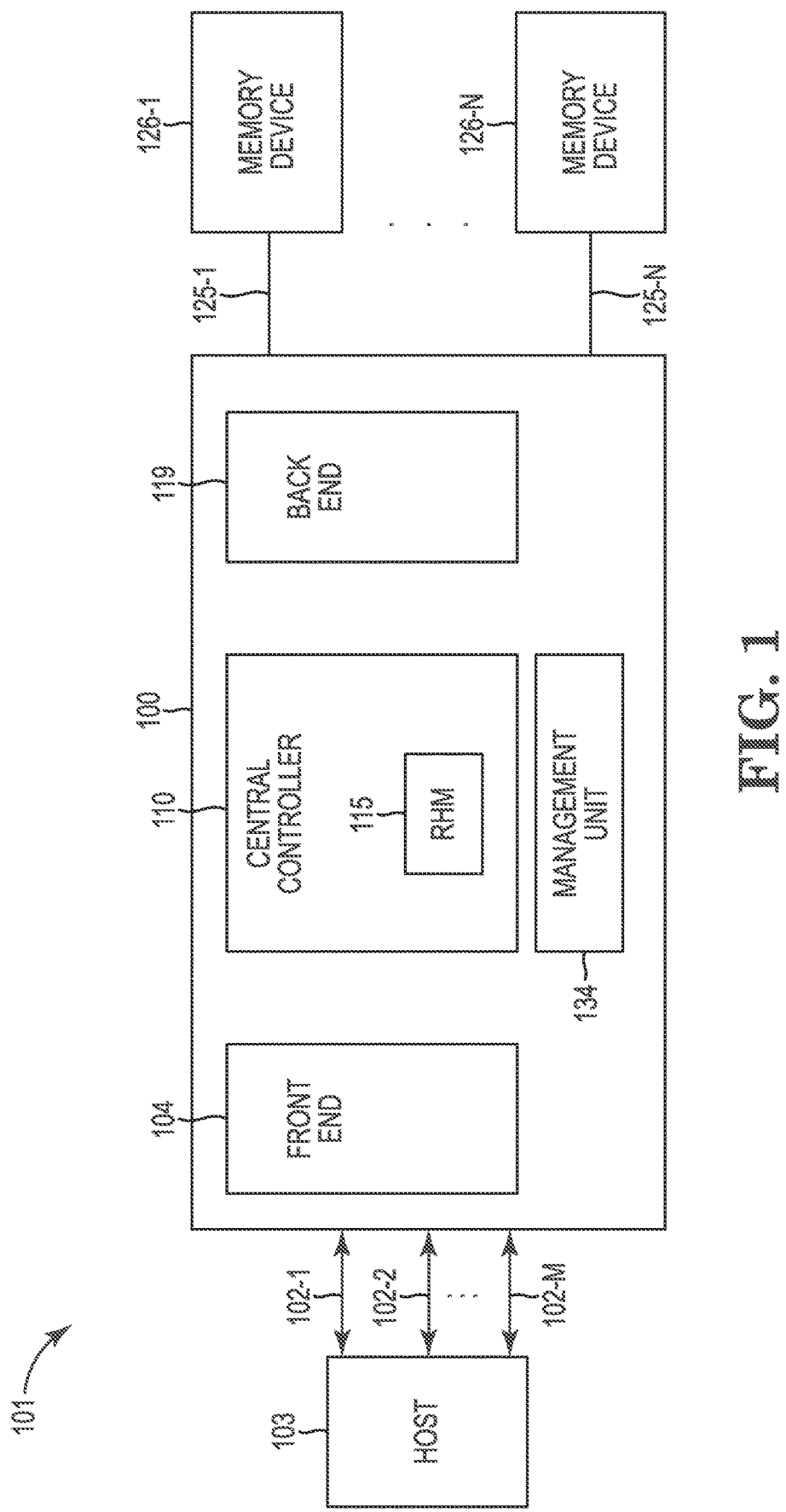
FIG. 1 is a functional block diagram of a computing system including a memory controller in accordance with a number of embodiments of the present disclosure.

Memory controllers for selectable row hammer mitigation are described. The memory controller can be included in an apparatus such as a memory system. A memory subsystem can be a storage system, storage device, a memory module, or a combination of such. An example of a memory system is a storage system such as a solid-state drive (SSD).

In some embodiments, the memory system can be a non-deterministic memory protocol compliant memory system such as a compute express link (CXL) compliant memory system. For instance, the host interface can be managed with CXL protocols and be coupled to the host via an interface configured for a peripheral component interconnect express (PCIe) protocol. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall memory system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

Row hammer refers to undesirable changes in capacitor voltages of a row of memory cells as a result of a neighboring row being frequently accessed. A row hammer attack may be employed to intentionally alter, gain access to, and/or corrupt data stored in memory by repeatedly accessing a particular row in rapid succession. For instance, a first row that is adjacent to a second row may be accessed repeatedly over a relatively short period of time. Accessing the first row repeatedly may leak voltage from memory cells coupled to the second row to memory cells coupled to the first row. The voltage leakage may cause data corruption to data stored in the memory cells coupled to the second row. The first row and the second row may not be directly adjacent but may be within a number of rows of each other. As used herein, memory cells and/or rows can be adjacent to each other if the memory cells and/or rows are physically located next to each other in a memory array or are within physical proximity sufficient to allow for the leakage of a charge from memory cells coupled to a row to different memory cells coupled to a different row. A row of memory cells can be next to a different row of memory cells if the addresses of the rows are consecutive and/or if there are no other rows between the adjacent rows. Memory cells may be adjacent to each other if the memory cells are coupled to rows that are adjacent to each other.

Moreover, due to various physical effects of shrinking manufacturing process geometries, a row hammer thresholds of memory systems have decreased to a level at which applications running on a host of a computer system can inadvertently corrupt their own data or the data of different applications sharing the same memory. As used herein, a row hammer threshold is a threshold quantity of accesses of a row of memory cells after which the memory cells in the row leak a charge.

Row hammer mitigation (e.g., detecting and responding to prevent) may be implemented utilizing internal probabilistic row hammer detector algorithms to initiate a preordained row hammer mitigation measure. Such row hammer mitigation has been implemented mainly in the memory devices themselves. However, implementing the row hammer mitigation strictly within the memory devices constrains the scope and abilities of row hammer mitigation given the cost of implementing the mitigation measures in chip real estate which provides a greater return on investment when utilized for additional storage space. Moreover, these row hammer mitigation strategies are unknown and/or are uncontrollable by memory device controllers.

Further, these row hammer mitigation measures are implemented as a one-size-fits-all approach. That is, a particular type of row hammer mitigation is implemented as the sole row hammer mitigation response for a memory device. Such a static approach to row hammer mitigation is not scalable to address row hammer attacks of different severity and/or size. Additionally, differing row hammer mitigation measure may impart different costs (e.g., power consumption, computational capacity consumption, processing delays, etc.) which have impacts of differing severities on the performance of the memory device. A static approach to row hammer mitigation locks in the cost of responding to row hammer by having only one row hammer mitigation response available to implement regardless of the severity or scale of an actual row hammer attack. Furthermore, the row hammer mitigation measure is not triggered until a row hammer threshold is exceeded, leaving no mechanism to head off or prevent an escalation of a row hammer attack.

Aspects of the present disclosure address the above and other deficiencies by implementing selectable row hammer mitigation responses. Distinct selectable row hammer mitigation responses may provide a diverse range of row hammer mitigation strategies that may be implemented in response to differing levels of row hammering activity. In some examples, the selection of row hammer mitigation responses from among a plurality of row hammer mitigation responses may be based on a comparison of row activations of a row to threshold portions of a row hammer threshold (RHT) for the row and/or its neighboring rows. By associating particular row hammer mitigation responses to particular threshold portions of an RHT, examples of the present disclosure may provide row hammer mitigation responses that scale with the intensity of row hammer activity. For example, when detected row hammer activity is comparably lower (e.g., relatively fewer repeated accesses over a time period since a last refresh) then a row hammer mitigation response which imposes a relatively lesser performance cost on a memory system may be selected and utilized to mitigate the row hammer activity without heavily impacting the performance of the memory system. Whereas, when detected row hammer activity is comparably higher (e.g., relatively more repeated access over a time period since a last refresh that may be approaching or exceeding the RHT for a row) then a more aggressive row hammer mitigation response which imposes a relatively greater performance cost on the memory system may be selected and utilized to mitigate the intensifying row hammer activity with lesser regard for the performance impacts to the memory system. Although the examples provided herein are in the context of row hammer attacks, the examples can also be applied to the loss of data due to memory cell leakage caused by accessing the memory cells or adjacent memory cells by any event at a greater rate than the RHT. That is, the examples provided herein may be triggered not only by an intentional row hammer attack but may also be triggered by unintentional and/or inadvertent hammering of a row caused by a normal operation of or a malfunction of an application.

Interfaces such as peripheral component interconnect express (PCIe), compute express link (CXL), cache coherent interconnect for accelerators (CCIX), etc. allow connecting a variety of memory devices to a host system. The combination of interfaces and memory technology improvements can allow for deploying "far memory", which can consist of system memory (e.g., memory devices) being implemented behind a front-end of a memory system such as PCIe, CXL, CCIX, GenZ, etc. As used herein, the front-end of the memory system can also be referred to as an interface of the memory system or as a front-end of a controller of the memory system. As used herein, the front-end of the memory system can comprise hardware and/or firmware configured to receive data (e.g., requests and/or data) and provide the data to a back-end of the memory system. The back-end of the memory system can comprise hardware and/or firmware to receive the data (e.g., requests and/or data) from the front-end of the memory system and can include perform the requests provided from the host on the memory devices of the memory system.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. It is to be understood that data can be transmitted, received, or exchanged by electronic signals (e.g., current, voltage, etc.) and that the phrase "signal indicative of [data]" represents the data itself being transmitted, received, or exchanged in a physical medium. The signal can correspond to a command (e.g., a read command, a write command, etc.).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Analogous elements within a Figure may be referenced with a hyphen and extra numeral or letter. See, for example, elements 102-1, 102-2, 102-M in FIG. 1. Such analogous elements may be generally referenced without the hyphen and extra numeral or letter. For example, elements 102-1, 102-2, 102-M may be collectively referenced as 102. As used herein, the designators "M" and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a functional block diagram of a computing system 101 including a memory controller 100 in accordance with a number of embodiments of the present disclosure. The memory controller 100 can include a front end portion 104, a central controller portion 110, and a back end portion 119. The computing system 101 can include a host 103 and memory devices 126-1, . . . , 126-N coupled to the memory controller 100. The memory controller 100 which is coupled to the host 103 can be discrete from the one or more of the memory devices 126-1, . . . , 126-N. The host 103 may include a system that may write data to the memory devices 126-1 . . . 126-N and/or read data from the memory devices 126-1 . . . 126-N. For example, the host 103 may write data to the memory devices 126-1 . . . 126-N utilizing the memory controller 100 and/or may read data from the memory devices 126-1 . . . 126-N utilizing the memory controller 100. For example, the host 103 may generate and/or communicate requests executable by the memory controller 100 to write data to and/or read data from the memory devices 126-1 . . . 126-N. The host 103 may be a computing device such as a desktop computer, laptop computer, network server, mobile device, or other such computing device that includes memory and a processing device. The host 103 may include, or be coupled to, the memory controller 100 and/or the memory devices 126-1 . . . 126-N so that the host 103 can read data from or write data to the memory devices 126-1 . . . 126-N. The host 103 may be coupled to the memory controller 100 and/or the memory devices 126-1 . . . 126-N via a physical interface. In some examples, the front end portion 104 of the memory controller 100 may form a portion of that physical interface.

The front end portion 104 includes an interface and interface management circuitry to couple the memory controller 100 to the host 103 through input/output (I/O) lanes 102-1, 102-2, . . . , 102-M and circuitry to manage the I/O lanes 102. There can be any quantity of I/O lanes 102, such as eight, sixteen, or another quantity of I/O lanes 102. In some embodiments, the I/O lanes 102 can be configured as a single port. In at least one embodiment, the interface between the memory controller 100 and the host 103 can be a PCIe physical and electrical interface operated according to a CXL protocol.

The central controller portion 110 can include and/or be referred to as data management circuitry. The central controller portion 110 can control, in response to receiving a request from the host 103, performance of a memory operation. Examples of the memory operation include memory access request such as a read operation to read data from a memory device 126 or a write operation to write data to a memory device 126.

The central controller portion 110 can generate error detection information and/or error correction information based on data received from the host 103. The central controller portion 110 can perform error detection operations and/or error correction operations on data received from the host 103 or from the memory devices 126. An example of an error detection operation is a cyclic redundancy check (CRC) operation. CRC may be referred to as algebraic error detection. CRC can include the use of a check value resulting from an algebraic calculation using the data to be protected. CRC can detect accidental changes to data by comparing a check value stored in association with the data to the check value calculated based on the data. An example of an error correction operation is an error correction code (ECC) operation. ECC encoding refers to encoding data by adding redundant bits to the data. ECC decoding refers to examining the ECC encoded data to check for any errors in the data. In general, the ECC can not only detect the error but also can correct a subset of the errors it is able to detect.

The back end portion 119 can include a media controller and a physical (PHY) layer that couples the memory controller 100 to the memory devices 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can include channels 125-1, . . . , 125-N. The channels 125 can include a sixteen pin data bus and a two pin data mask inversion (DMI) bus, among other possible buses. The back end portion 119 can exchange (e.g., transmit or receive) data with the memory devices 126 via the data pins and exchange error detection information, RAID information, and/or error correction information with the memory devices 126 via the DMI pins. The error detection information and/or error correction information can be exchanged contemporaneously with the exchange of data.

An example of the memory devices 126 is dynamic random access memory (DRAM) operated according to a protocol such as low-power double data rate (LPDDRx), which may be referred to herein as LPDDRx DRAM devices, LPDDRx memory, etc. The "x" in LPDDRx refers to any of a number of generations of the protocol (e.g., LPDDR5).

In some embodiments, the memory controller 100 can include a management unit 134 to initialize, configure, and/or monitor characteristics of the memory controller 100. The management unit 134 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

In addition, the central controller portion 110 can include a row hammer mitigator (RHM) 115. However, as detailed herein, in some embodiments the RHM 115 can be located elsewhere within the memory controller 100 (e.g., front end 104, back end 119, etc.). For example, the RHM 115 may be located in the central controller 110, the back end 119, a bank controller for a memory device 126-1 . . . 126-N, a channel controller for a memory device 126-1 . . . 126-N, or combinations thereof.

The RHM 115 may include circuitry and/or instructions executable to detect row hammer activity (e.g., repeated accesses of data in a particular row over a period of time since a last refresh) and select a row hammer mitigation response from among a plurality of row hammer mitigation responses to be initiated to mitigate any row hammer effects (e.g., data corruption) while imposing a performance cost in proportion to the scale and/or severity of the row hammer activity.

For example, the RHM 115 may include circuitry and/or instructions executable to determine whether a quantity of row activations directed to a row of the memory devices 126-1 . . . 126-N meets or exceeds a row hammer criterion (RHC). As used herein, an RHC may include a proportion of the quantity or row hammer activations to a row hammer threshold (RHT) exceeding a particular threshold value from among a plurality of threshold values. For example, the RHC may be a part of a quantity and/or an entire quantity of row activations occurring over a period of time comprising an RHT. For example, an RHC may include a proportion of (e.g., ¼, ½, ⅔, ¾, 1/1, etc.) of a quantity of row activations to a particular row or group of rows, the quantity being a quantity defining the RHT or quantity of row activations associated with producing row hammer effects in a row hammer attack. The RHC may represent a proportion of an RHT and the comparison of the quantity of row activations directed to a row of the number of memory devices may be utilized to determine how close the quantity of row activations is to reaching an RHT and/or whether the quantity of row activations has reached or exceeded the RHT. In some examples, the RHC may be a quantity of activations for a particular row or rows. For example, an RHC may be an RHC for a single row, a group of rows, all the rows, etc. of the memory devices 126-1 . . . 126-N. That is each particular row, group of rows, all the rows, etc. may have specific or distinct RHCs associated therewith.

In some examples, the RHM 115 may determine whether the quantity of row activations directed to the row of the memory devices meets or exceeds the RHC responsive to intercepting a row activation command (e.g., a data access request for data to be retrieved from a row of the memory devices 126-1 . . . 126-N requiring activation of the row) directed to the row of the memory devices.

The RHM 115 may include circuitry and/or instructions executable to select a row hammer mitigation response from a plurality of row hammer mitigation responses available for initiation by the memory controller 101. In some examples, the selection of a row hammer mitigation response may be performed responsive to determining that the RHC is met, is exceeded, is about to be exceeded, etc. The particular row hammer mitigation response being selected from among the plurality of row hammer mitigation responses may be selected on the basis of the quantity of row activations meeting, exceeding, being about to exceed, etc. a particular RHC or RHCs from among a plurality of RHCs. That is, the RHM 115 may include and/or have access to a table including associations between each of a plurality of RHCs and respective ones of a plurality of row hammer mitigation responses to be implemented in response to meeting, exceeding, and/or being about to exceed the various RHCs. In this manner, the RHM 115 may select one or more row hammer mitigation responses to perform in response to a quantity of row activations directed to a row exceeding one or more RHCs associated to the row hammer mitigation responses.

The RHM 115 may then initiate the selected row hammer mitigation response and/or responses. The RHM 115 may initiate the selected response by transmitting a command to other portions of the memory controller 101, to the memory devices 126-1 . . . 126-N, to a host operating system, etc. to execute the selected row hammer mitigation response. Since the selection and initiation of the various row hammer mitigation response options is based on the row activations meeting, exceeding, and/or being about to exceed various row hammer criteria, the RHM 115 may effectively scale a row hammer response or responses to an intensity or scale of a row hammer attack. For example, each of the RHCs may correspond to a respective different scale of a suspected row hammer attack. For example, a first RHC associated with a quantity of activations making up a lower proportion of the RHT may indicate a lower scale or intensity of a suspect row hammer attack than a second RHC associated with a quantity of activations making up a relatively higher proportion of the RHT. As described in greater detail below, by implementing a mechanism whereby a row hammer mitigation response of a first scale (e.g., causing a first amount of delay to the system, utilizing a first amount of processing resources, causing a first amount of process interruption, etc.) is selected in response to the first RHC being met and a row hammer mitigation response of a second scale (e.g., causing a relatively larger second amount of delay to the system, utilizing a relatively larger second amount of processing resources, causing a relatively larger second amount of process interruption, etc.) is selected in response to the second RHC being met, an RHM 115 may adjust a scale or intensity of a row hammer mitigation strategy to a scale or intensity of a suspected row hammer attack.

Figure 2:
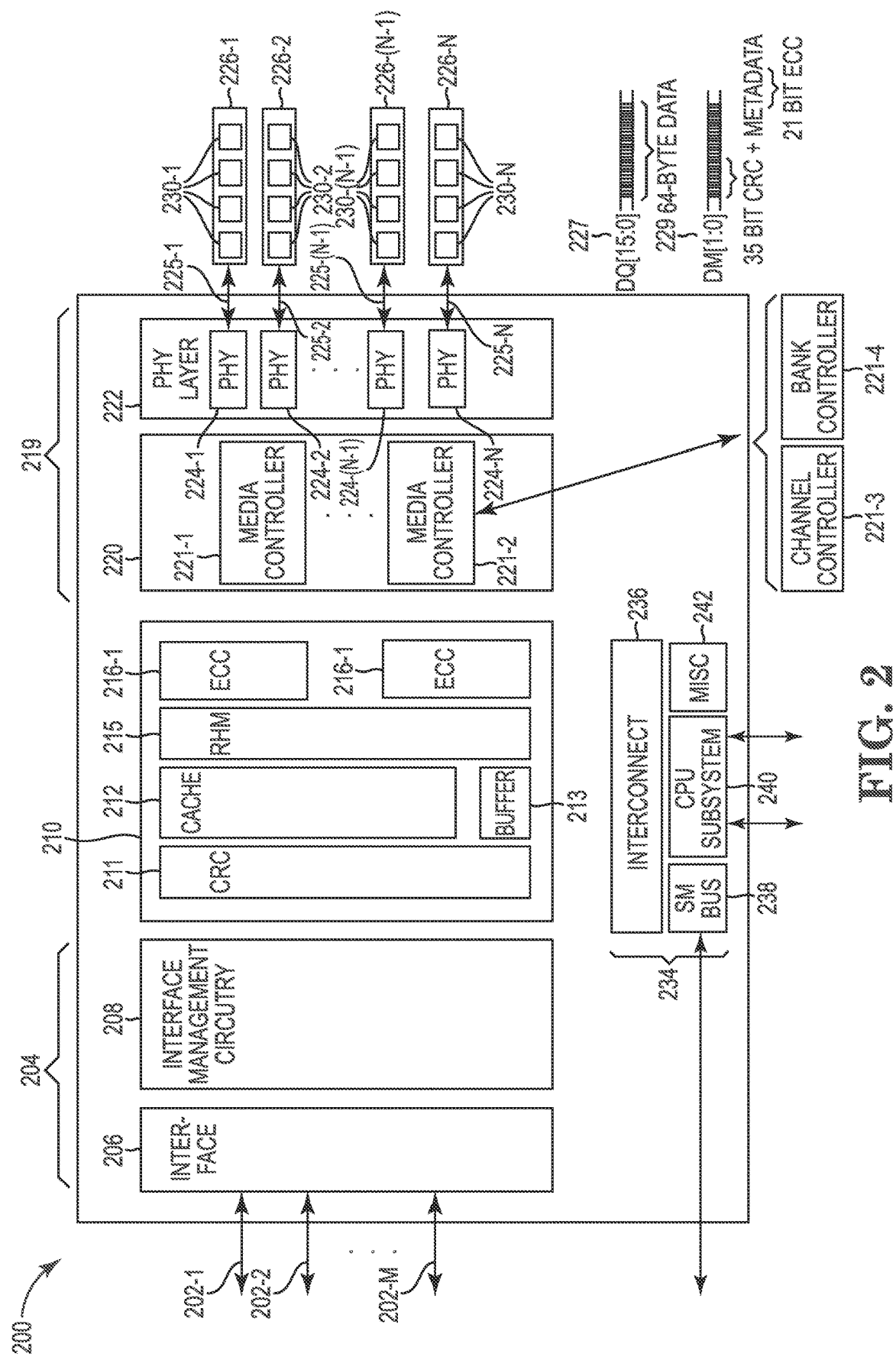
FIG. 2 is a functional block diagram of a memory controller in accordance with a number of embodiments of the present disclosure.

FIG. 2 is a functional block diagram of a memory controller 200 having a first configuration in accordance with a number of embodiments of the present disclosure. As shown in FIG. 2, a front end portion 204 can include an interface 206, which includes multiple I/O lanes 202-1, 202-2, . . . , 202-M, as well as interface management circuitry 208 to manage the interface 206. An example of the interface 206 is a peripheral component interconnect express (PCIe) 5.0 interface.

In some embodiments, the memory controller 200 can receive access requests involving at least one of the cache memory 212 and the memory devices (e.g., die) 226-1, 226-2, . . . , 226-(N−1), 226-N via the interface 206 according to a non-deterministic memory protocol such as a CXL protocol. The interface 206 can receive data from a host (e.g., the host 103 shown in FIG. 1) through the I/O lanes 202. The interface management circuitry 208 may use a non-deterministic protocol such as CXL protocols to manage the interface 206 and may be referred to as CXL interface management circuitry 208. The CXL interface management circuitry 208 can be coupled to a host via the PCIe interface 206.

Central controller 210 (also referred to herein as data management circuitry 210) can be coupled to the interface management circuitry 208. The data management circuitry 210 can be configured to cause performance of a memory operation. The data management circuitry 210 can include at least one of error detection circuitry 211 (e.g., "CRC circuitry") and error correction circuitry 216. The error detection circuitry 211 can be configured to perform error detection operations on data. For example, the error detection circuitry 211 can be configured to generate a check value resulting from an algebraic calculation on data received from the interface management circuitry 208 and to transmit the check value to at least one of the cache memory 212, buffer 213, and media control circuitry 220. The check value can be referred to as CRC data or error detection data.

In at least one embodiment, the error detection circuitry is configured to perform an error detection operation on data received from the interface management circuitry prior to the data being cached and/or operated on by the error correction circuitry 216. Another example of an error detection operation is to generate a check value resulting from an algebraic calculation on data received from the media control circuitry and a comparison of that check value with a check value received from the media control circuitry 220 to determine whether the data includes an error (e.g., if the two check values are not equal).

The data management circuitry 210 can include a cache memory (cache) 212 to store data, error detection information, error correction information, and/or metadata associated with performance of the memory operation. An example of the cache memory 212 is a thirty two (32) way set-associative cache memory including multiple cache lines. The cache line size can be equal to or greater than the memory controller 200 access granularity (e.g., 64 bytes for a CXL protocol). For example, each cache line can include 256 bytes of data. In another example, each cache line can include 512 bytes of data. Read and write requests of CXL memory systems can be 64 bytes in size. Therefore, data entries in the cache memory 212 can have 64 bytes of data. Each cache line can comprise 256 bytes. Therefore, multiple 64 byte requests can be stored in each cache line. In response to a request from the host, the memory controller 200 can write 256 bytes of data to a memory device 226. In some embodiments, the 256 bytes of data can be written in 64 byte chunks. Use of the cache memory 212 to store data associated with a read operation or a write operation can increase a speed and/or efficiency of accessing the data because the cache memory 212 can prefetch the data and store the data in multiple 64 byte blocks in the case of a cache miss. Instead of searching a separate memory device, the data can be read from the cache memory 212. Less time and energy may be used accessing the prefetched data than would be used if the memory system has to search for the data before accessing the data.

The data management circuitry 210 can include a buffer 213 to store data, error detection information, error correction information, and/or metadata subject to an operation thereon by another component of the data management circuitry 210 (e.g., the error detection circuitry 211, the error correction circuitry 216, and the low-power chip kill circuitry 214). The buffer 213 can allow for the temporary storage of information, for example, while another component of the data management circuitry 210 is busy. In some embodiments, the cache memory 212 can be used to temporarily store data and the buffer 213 can be used to temporarily store other information associated with the data, such as error detection information, error correction information, and/or metadata.

The data management circuitry can include low-power chip kill (LPCK) circuitry (not illustrated). For instance, the LPCK circuitry can be coupled between the error detection circuitry 211 and the error correction circuitry 216. The LPCK circuitry can be configured to perform chip kill operations on the data. The term "chip kill" generally refers to a form of error correction that protects memory systems (e.g., the memory system 101 shown in FIG. 1) from any single memory device 226 (chip) failure as well as multi-bit error from any portion of a single memory chip. The LPCK circuitry can increase the stability of the data and correct errors in the data. The LPCK circuitry can implement the desired LPCK protection collectively across subsets of the memory devices 226 (e.g., LPCK can be provided for a first subset of the memory devices 226-1, 226-2 and separately for s second subset of the memory devices 226-(N−1), 226-N) or across all of the memory devices 226.

An example chip kill implementation for the memory controller 200 including an eleven channel 225 bus having a width of 176 bits coupled to eleven memory devices 226 can include writing data to eight of the eleven memory devices 226 and parity data to three of the eleven memory devices 226. Four codewords can be written, each composed of eleven four-bit symbols, with each symbol belonging to a different memory device 226. A first codeword can comprise the first four-bit symbol of each memory device 226, a second codeword can comprise the second four-bit symbol of each memory device 226, a third codeword can comprise the third four-bit symbol of each memory device 226, and a fourth codeword can comprise the fourth four-bit symbol of each memory device 226.

The three parity symbols can allow the LPCK circuitry to correct up to one symbol error in each codeword and to detect up to two symbol errors. If instead of adding three parity symbols, only two parity symbols are added, the LPCK circuitry can correct up to one symbol error but only detect one symbol error. In some embodiments, the data symbols and the parity symbols can be written or read concurrently from the memory devices 226. If every bit symbol in a die fails, only the bit symbols from that memory device 226 in the codeword will fail. This allows memory contents to be reconstructed despite the complete failure of one memory device 226. LPCK is considered to be "on-the-fly correction" because the data is corrected without impacting performance by performing a repair operation. The LPCK circuitry 214 can include combinational logic that uses a feedforward process.

In contrast, a redundant array of independent disks (RAID) is considered to be "check-and-recover correction" because a repair process is initiated to recover data subject to an error. In some embodiments, the data management circuitry 210 includes RAID circuitry (not illustrated). For instance, the data management circuitry 210 can include RAID circuitry in lieu of LPCK circuitry. The RAID circuitry can provide one or more of data mirroring, data parity, striping, and combinations thereof depending on the particular implementation. The RAID circuitry can operate on data in conjunction with the error detection circuitry 211 to provide check-and-recover correction, whereas LPCK can provide on-the-fly correction. More specifically, the error detection circuitry can detect an error in data and the RAID circuitry can recover correct data in response. In at least one embodiment, the check-and-recover correction provided by the error detection circuitry 211 and the RAID circuitry is supplemental to the error correction provided by the error correction circuitry 216. For example, if data read from the memory devices 226 has an error correctable by the error correction circuitry 216, it can do so without further data recovery by the RAID circuitry. However, if an error persists that is not correctable by the error correction circuitry 216, then the data may be recoverable by the RAID circuitry. As another example, an error may escape detection by the error correction circuitry 216, but be detected by the error detection circuitry 211. In such an example, the underlying data may be recoverable by the RAID circuitry.

As shown in FIG. 2, the data management circuitry 210 can include error correction circuitry 216-1, 216-2 configured to perform error correction operations on the data (e.g., ECC encode the data and/or ECC decode the data). The error correction circuitry 216 can be coupled to the error detection circuitry 211 for embodiments (not specifically illustrated) that do not include the cache 212, buffer 213.

Although two error correction circuits 216 are illustrated, embodiments are not so limited. Embodiments can include only one error correction circuit 216 or more than two error correction circuits 216 in the data management circuitry 210. In at least one embodiment, the memory controller 200 can include an equal quantity of error correction circuits 216-1, 216-2 as media controllers 221-1, 221-2. The media controller 221-1, 221-2 can each include a respective channel controller and bank controller. For instance, media controller 221- can include channel controller 221-3 and bank controller 221-4. In at least one embodiment, the data can be protected by the error detection circuitry 211, LPCK circuitry, and/or the error correction circuitry 216 before being written to the memory devices 226.

The data management circuitry 210 can include the cache memory 212 and the buffer 213 coupled between the interface management circuitry 208 and the error correction circuitry 216. A quantity of error detection circuits and/or and a quantity of error correction circuits can be equal to the quantity of PHY memory interfaces 224-1, 224-2, . . . , 225-(N−1), 225-N. In such embodiments, there is a 1:1:1 correlation between the error correction circuits, the error detection circuits, and the memory devices. Though other configurations such as the configuration illustrated in FIG. 2 are possible.

The central controller 210 may include data management circuitry, which can include the cache memory 212 and the buffer 213 coupled between the interface management circuitry 208 and the error correction circuitry 216. As shown in FIG. 2, the memory controller 200 can include a back end portion 219 including a media control circuitry 220 coupled to the data management circuitry 210. The media control circuitry 220 can include media controllers 221-1, 221-2. The back end portion 219 can include a physical (PHY) layer 222 having PHY memory interfaces 224-1, 224-2, . . . , 224-(N−1), 224-N. Each physical interface 224 is configured to be coupled to a respective memory device 226.

The PHY layer 222 can be a memory interface to configured for a deterministic memory protocol such as a LPDDRx memory interface. Each of the PHY memory interfaces 224 can include respective data pins 227 and DMI pins 229. For example, each PHY memory interface 224 can include sixteen data pins 227 "[15:0]" and two DMI pins 229 "[1:0]". The media control circuitry 220 can be configured to exchange data with a respective memory device 226 via the data pins 227. The media control circuitry 220 can be configured to exchange error correction information, error detection information, and/or metadata via the DMI pins 229 as opposed to exchanging such information via the data pins 227. The DMI pins 229 can serve multiple functions, such as data mask, data bus inversion, and parity for read operations by setting a mode register. The DMI bus uses a bidirectional signal. In some instances, each transferred byte of data has a corresponding signal sent via the DMI pins 229 for selection of the data. In at least one embodiment, the data can be exchanged contemporaneously with the error correction information, RAID information, and/or the error detection information. For example, 64 bytes of data can be exchanged (transmitted or received) via the data pins 227 while 35 bits of error detection information (and metadata) and 21 bits of error correction information are exchanged via the DMI pins 229. Such embodiments reduce what would otherwise be overhead on the DQ bus for transferring error correction information, error detection information, and/or metadata.

The back end portion 219 can couple the PHY layer portion 222 to memory banks 230-1, 230-2, . . . , 230-(N−1), 230-N of memory devices 226-1, 226-2, . . . , 226-(N−1), 226-N. The memory devices 226 each include at least one array of memory cells. In some embodiments, the memory devices 226 can be different types of memory. The media control circuitry 220 can be configured to control at least two different types of memory. For example, the memory devices 226-1, 226-2 can be LPDDRx memory operated according to a first protocol and the memory devices 226-(N−1), 226-N can be LPDDRx memory operated according to a second protocol different from the first protocol. In such an example, the first media controller 221-1 can be configured to control a first subset of the memory devices 226-1, 226-2 according to the first protocol and the second media controller 221-2 can be configured to control a second subset of the memory devices 226-(N−1), 226-N according to the second protocol. In a specific example, the memory devices 226-1, 226-2 may have on board error correction circuitry. Although not specifically illustrated, for some embodiments, the media controller circuitry 220 can include a single media controller 221.

As used herein, the term "substantially" means that the characteristic need not be absolute, but is close enough so as to achieve the advantages of the characteristic. For example, "substantially contemporaneously" is not limited to operations that are performed absolutely contemporaneously and can include timings that are intended to be contemporaneous but due to manufacturing limitations may not be precisely contemporaneous. For example, due to read/write delays that may be exhibited by various interfaces (e.g., LPDDR5 vs. PCIe), media controllers that are utilized "substantially contemporaneously" may not start or finish at exactly the same time. For example, the memory controllers can be utilized such that they are writing data to the memory devices at the same time regardless of whether one of the media controllers commences or terminates prior to the other.

The memory controller 200 can include a management unit 234 configured to initialize, configure, and/or monitor characteristics of the memory controller 200. In some embodiments, the management unit 234 includes a system management (SM) bus 238. The SM bus 238 can manage out-of-band data and/or commands. The SM bus 238 can be part of a serial presence detect. In some embodiments, the SM bus 238 can be a single-ended simple two-wire bus for the purpose of lightweight communication. The management unit 234 can include a CPU subsystem 240, which can function as a controller for the management unit to execute instructions associated with initializing, configuring, and/or monitoring the characteristics of the memory controller 200. The management unit 234 can include miscellaneous circuitry 242, such as local memory to store codes and/or data associated with managing and/or monitoring the characteristics of the memory controller 200. An endpoint of the management unit 234 can be exposed to the host system (e.g., the host 103 shown in FIG. 1) to manage data. In some embodiments, the characteristics monitored by the management unit 234 can include a voltage supplied to the memory controller 200 and/or a temperature measured by an external sensor. The management unit 234 can include an interconnect 236, such as an advanced high-performance bus (AHB) to couple different components of the management unit 234.

The management unit 234 can include circuitry to manage in-band data (e.g., data that is transferred through the main transmission medium within a network, such as a local area network (LAN)). In some embodiments, the CPU subsystem 240 can be a controller that meets the Joint Test Action Group (JTAG) standard and operate according to an Inter-Integrate Circuit ($I^2C$ or $I^3C$) protocol, and auxiliary I/O circuitry. JTAG generally refers to an industry standard for verifying designs and testing printed circuitry boards after manufacture. $I^2C$ generally refers to a serial protocol for a two-wire interface to connect low-speed devices like microcontrollers, I/O interfaces, and other similar peripherals in embedded systems. In some embodiments, the auxiliary I/O circuitry can couple the management unit 234 to the memory controller 200. Further, firmware for operating the management unit can be stored in the miscellaneous circuitry 242. In some embodiments, the miscellaneous circuitry 242 can be a flash memory such as flash NOR memory or other persistent flash memory device.

In various embodiments, a controller coupled to one or more of the number of memory devices includes a row hammer mitigator (RHM) 215. The RHM 215 may include hardware and/or software or other logic components to facilitate selection and initiation of row hammer mitigation responses in a manner that minimizes system performance degradation at low levels of row hammer activity but can be scaled to match higher levels of row hammer activity with row hammer mitigation responses that have an elevated impact on performance but may be more effective at ceasing row hammering activity.

As detailed herein, the row hammer mitigator may be disparate from the memory devices 226-1 . . . 226-N and may instead be included in the central controller 210 located apart from the memory devices 226, however examples are not so limited. For instance, in various embodiments row hammer mitigator may be included in the central controller 210, a back end portion 219 including a media control circuitry 220, a channel controller 221-2, a bank controller 222-1, or combinations thereof, as detailed herein.

In some examples, the RHM 215 may monitor a quantity of row activations directed to rows of one or more memory devices 226-1 . . . 226-N. For example, the RHM 215 may include and/or be in communication with a row hammer detector which detects accesses (e.g., row activations) to individual rows, groups of rows, each of a plurality of rows, etc. of one or more memory devices 226-1 . . . 226-N. The RHM 215 may maintain a count of the quantity of row activations to a monitored row or rows. For example, the RHM 215 may utilize a counter that counts a quantity of activations to a row or activations to a row occurring over a timer period (e.g., a time period since a prior refresh of the data in the row or rows). The counter for each row or rows may be incremented each time an activation of that row or rows is performed. The counter may be reset each time the data in the corresponding row or rows is refreshed. As such, the counter may provide an accurate count of the quantity of cumulative row activations experienced by a row or rows over a time period having elapsed since a prior refresh of the row.

The RHM 215 may determine whether a quantity of row activations directed to a row or rows of the memory devices 226-1 . . . 226-N meets, exceeds, is about to exceed, etc. a row hammer criterion utilized as a row hammer mitigation response triggering threshold. For example, the RHM 215 may determine whether the quantity of row activations directed to a particular row or groups of rows of the memory devices meets, exceeds, and/or is about to exceed a RHC for that row or rows. In some examples, the RHC may include a proportion of a plurality of rows of a memory device 226-1 . . . 226-N meeting, exceeding, or about to exceed a respective RHC. For example, the RHM 215 may determine whether a threshold quantity of rows of a plurality of rows of a memory device 226-1 . . . 226-N exceeding a proportion of an RHT.

The RHM 215 may make this determination by comparing the monitored quantity of row activations for the rows to a response table specifying the triggering thresholds (e.g., RHCs). The response table may store associations between threshold activation quantities and corresponding row hammer mitigation responses to be employed in response to meeting, exceeding, or being about to exceed the threshold activation quantities. The response table may include a plurality of entries. Each entry may specify an RHC representing a triggering threshold for various row hammer mitigation responses. For example, the table may specify a plurality of distinct row hammer mitigation strategies to be employed responsive to a corresponding RHC being met, exceeded, being about to be met or exceeded, etc.

Each RHC may be associated with a different magnitude. For example, each RHC may correspond to a different quantity of row activations over a period of time. Those RHCs defined by relatively more row activations over a period of time may be considered to be of a greater magnitude than those defined by relatively fewer row activations over a period of time. In addition, those RHCs defined by a lesser proportion of a total quantity of activations making up an RHT may be considered to be of a lesser magnitude than those defined by a greater proportion of the total quantity of activations making up an RHT. That is, the closer the quantity of activations making up an RHC is to the quantity of activations making up an RHT, the greater its relative magnitude.

The magnitude of the RHC may correspond to a scale of a suspected row hammer attack. That is, the smaller the smaller the magnitude of the RHC (e.g., the less frequent activations over the time period, the lower proportion of the RHT, etc.) the less severe the corresponding suspected row hammer attack is assumed to be and the greater the magnitude of the RHC (e.g., the more frequent activations over the time period, the greater proportion of the RHT, etc.) the more severe the corresponding suspected row hammer attack is assumed to be.

A plurality of row hammer mitigation responses may be specified in the response table. Each of the plurality of row hammer mitigation responses may be associated with a corresponding triggering threshold (e.g., RHC). A magnitude of a performance impact imposed by each of the plurality of row hammer mitigation responses on a memory system may be matched to the scale of the suspected row hammer attack. That is, the smaller the magnitude of the RHC (e.g., the less frequent activations over the time period, the lower proportion of the RHT, etc.) the less severe the corresponding suspected row hammer attack is assumed to be and the less impactful on memory system performance the associated row hammer mitigation response triggered by meeting or exceeding the RHC. Likewise, the greater the magnitude of the RHC (e.g., the more frequent activations over the time period, the greater proportion of the RHT, etc.) the more severe the corresponding suspected row hammer attack is assumed to be and the more impactful on system performance the associated row hammer mitigation response triggered by meeting or exceeding the RHC. In this manner, the row hammer mitigation response may be scaled in intensity and system performance degradation to match the scale and/or intensity of a suspected row hammer attack.

The RHM 215 may select a row hammer mitigation response from among a plurality of row hammer mitigation responses available to the memory controller 200. The RHM 215 may select the row hammer mitigation response based on the row activations exceeding a triggering threshold (e.g., RHC). For example, the RHM 215 may select a first row hammer mitigation response responsive to the quantity of row activations directed to a monitored row or rows exceeding a first threshold quantity of activations since a last refresh of the row or rows (e.g., a first RHC). The first row hammer mitigation response may impose a first impact of a performance of the memory system. The RHM 215 may additionally or alternatively select a second row hammer mitigation response responsive to the quantity of row activations directed to a monitored row or rows exceeding a second threshold quantity of activations since a last refresh of the rows (e.g., a second RHC). The second row hammer mitigation response may be selected instead of, in addition to, and/or in a subsequent comparison from the first row hammer mitigation response. The second threshold quantity of activations may be greater than the first threshold quantity of activations and the second row hammer mitigation response may impose a greater performance impact on the memory system than the first row hammer mitigation response.

In some examples, the RHM 215 may select the second row hammer mitigation response additionally responsive to an execution of the first row hammer mitigation response failing to prevent the quantity of row activations from exceeding the second threshold quantity of row activations since the last refresh of the plurality of rows. Since, as described above, the second threshold quantity of row activations may be higher than the first quantity of row activations, exceeding the second quantity of row activations after having initiated the first row hammer mitigation response may be an indication that the first row hammer mitigation response has failed to mitigate the row hammer attack and selection of a more aggressive mitigation approach is warranted. For example, if the RHM 215 has exhausted all of its row hammer mitigation responses that are able to be enacted on the memory controller 200 and the quantity of row activations has continued to increase, then the RHM 215 may send a command to a host operating system to begin host operating system-side row hammer mitigation measures.

The RHM 215 may initiate the selected row hammer response. The RHM may initiate the selected row hammer response by issuing a response triggering command from the central controller 210, the channel controller 221-3, the bank controller 221-4, or combinations thereof.

Figure 3:
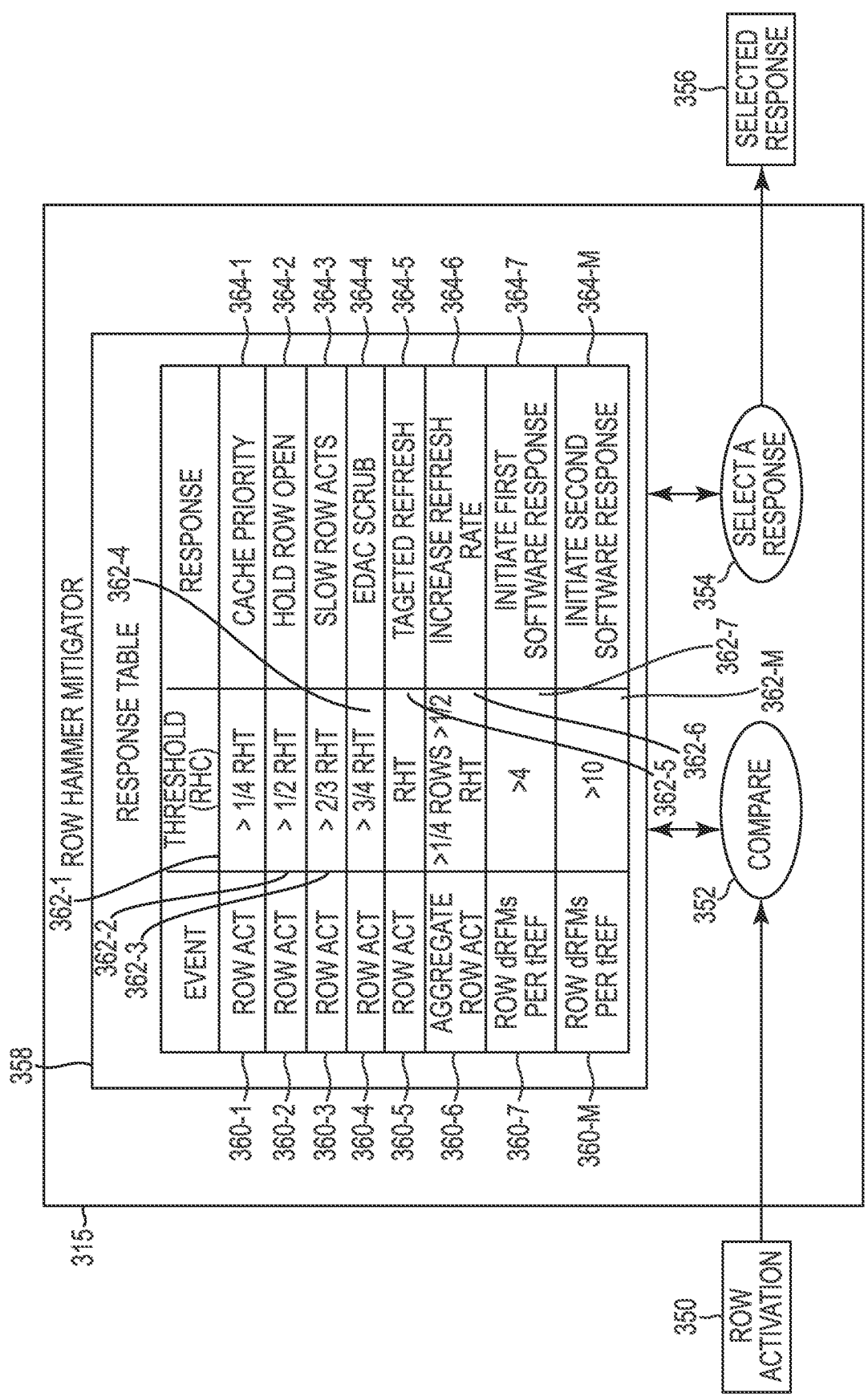
FIG. 3 is a functional block diagram of a row hammer mitigator in accordance with a number of embodiments of the present disclosure.

FIG. 3 is a functional block diagram of a row hammer mitigator (RHM) 315. The RHM 315 may include hardware, software, and/or other logic which may be resident in and/or executed at any portion or portions of a memory controller (e.g., memory controller 200 in FIG. 2). For example, in various embodiments the RHM 315 may be partially and/or fully included in the central controller of a memory controller, a back end portion of a memory controller including a media control circuitry, a channel controller of a memory controller, a bank controller of a memory controller, or combinations thereof, as detailed herein.

Regardless of where in a memory controller the RHM 315 is instantiated or executed, it may monitor row activations 350. For example, a memory controller interface (e.g., interface 206 as illustrated in FIG. 2) can receive data (e.g., receive a signal indicative of data associated with a memory access request) from the host through the I/O lanes (e.g., I/O lanes 202 illustrated in FIG. 2). This signal may, for example, include a request to access data located in a memory device (e.g., memory devices 226-1 . . . 226-N in FIG. 2). The signal may include a request to access data stored a particular row of a particular bank of a particular memory device. As such, accessing the data may include activating the particular row. As described above, repeated row activations occurring over a particular time interval may create a row hammer effect corrupting data in adjacent rows. Therefore, monitoring such row activation commands may provide a mechanism to monitor, predict, detect, and respond to row hammer events.

The row activation command 350 can be transmitted to or intercepted by a controller such as a central controller (e.g., central controller 210 as illustrated in FIG. 2) or other memory controller components. The RHM 315 may detect the row activation command 350. Detecting the row activation command 350 may include determining which row or group of rows a data access request is targeting for activation. That is, detecting the row activation command 350 may include determining a specific row or rows to which the row activation command 350 is directed. In some examples, detecting the row activation command 350 may include determining neighboring rows affected by an activation of a row specified in the row activation command 350.

The RHM 315 may incorporate the detected row activation command 350 into a cumulative row activation count for its corresponding row. For example, the RHM 315 may track every row activation command received at a memory controller and may maintain and/or access a log of all the row activation commands tracked for each row or group of rows being monitored by the RHM 315. In some examples, this may include incrementing a counter of a quantity of row activations for a row each time that row is the subject of a received row activation command 350 and/or each time the row activation for that row is initiated. The counter may be reset and/or the count may be restarted in the counter each time the subject row is refreshed. As such, the counters may keep a tally of the aggregate quantity of row activations that have occurred since a prior refresh of the data in the subject row. In addition, the RHM 315 may track aggregate statistics for a group of rows. For example, the RHM 315 may track a quantity of row activations across a plurality of rows being monitored. In this manner, trends regarding row activations across a plurality of rows may be simultaneously realized and/or identified. For example, a trend regarding a portion of a plurality of rows having exceeded a RHC may be tracked.

The RHM 315 may, responsive to detecting the row activation command 350, determine whether a quantity of row activations directed to a row of the memory devices exceeds a RHC. The RHM 315 may make this determination utilizing a comparison 352 between the cumulative tracked quantity of row activations for a particular row or group of rows to a response table 358.

The response table 358 may include a data structure stored at a same location as and/or accessible by the RHM 315. The response table 358 may be populated at manufacture, at a CXL subsystem power-on or boot, or during operation by a host operating system and/or hypervisor. The response table 358 and/or portions thereof may be non-overwritable by a host operating system or hypervisor or an attacker that gains operating system privileges. In this manner, the triggering thresholds (e.g., RHC) and the corresponding responses specified in the response table 358 may not be susceptible to any manipulation which may expose the data in the memory devices to corruption through row hammer attacks.

The response table 358 may include event definitions 360-1 . . . 360-M. The event definitions 360-1 . . . 360-M may include definitions of detected events associated with a corresponding triggering threshold 362-1 . . . 362-M.

For example, an event definition (e.g., 360-1 . . . 360-5) may include a row activation ("ROW ACT"). A row activation event may include an activation of a row storing data in order to accesses the data stored in the row. Detection of a row activation may trigger a comparison of a quantity of row activations for a particular row or group of rows to a threshold quantity of row activations 362-1 . . . 362-4. For example, the row activation command 350 for a particular row may be detected and the row activation counter for that row may be incremented to reflect its detection. Then, the total quantity of row activations for that row since the last refresh, as indicated by the incremented counter, may be compared to a triggering threshold or triggering thresholds 362-1 . . . 362-5 corresponding to row activation counts for a particular row. The triggering thresholds 362-1 . . . 362-5 may correspond to a counted quantity of activations in some examples. In some examples, the triggering thresholds 362-1 . . . 362-5 may correspond to a proportion of a quantity of activations. For example, the triggering thresholds 362-1 . . . 362-5 may correspond to a proportion, represented by a fraction, of a quantity of activations defining an RHT. For example, the triggering thresholds 362-1 . . . 362-5 may correspond to ¼ of the RHT quantity of activations, ½ of the RHT quantity of activations, ⅔ of the RHT quantity of activations, ¾ of the RHT quantity of activations, 1/1 of the RHT quantity of activations, etc.) that when met and/or exceeded are to trigger a corresponding response 364-1 . . . 364-5. The responses 364-1 . . . 364-M may include row hammer mitigation responses to mitigate and prevent additional row activations contributing to the row hammer effect on a row.

An example of a response 364-1 may include assigning and/or adjusting a cache priority 364-1 of data being repeatedly accessed from the row having crossed a corresponding row activation threshold quantity. For example, when a cache is enabled in the memory controller the data accessed by the row activation may be sent to the cache to satisfy the request. As such, assigning a cache priority 364-1 may include sending the data to the cache with a priority assignment that causes the data to be prioritized for being held on to in the cache for a longer period of time than it might otherwise be. In this manner, it is made more likely that the data will still be present in the cache the next time an access request is received for the data. Since the data will still be in the cache and can be accessed from there, a cache miss resulting in another row activation to retrieve the data may be avoided. As such, the response 364-1 may be initiated by the RHM 315 by prioritizing holding of data, returned from a request associated with a row activation directed to the row, in a cache accessible to satisfy subsequent requests for the data instead of by activating the row. The example event 360-1, threshold 362-1, and/or response 364-1 relationship is a non-limiting example provided for illustrative purposes. Other combinations of and/or relationships between events, thresholds, responses and/or combinations thereof are contemplated for the response table 358.

Another example of a response 364-2 may include holding open a row having crossed a corresponding row activation threshold quantity. For example, when a row is activated to access data it may be closed once the data has been accessed. However, the response 364-2 may include extending the amount of time that the row is held open for beyond the typical amount of time associated with completing the access request. By leaving the row open and active for a longer period of time it increases the likelihood that another access request for that row will come in and may be serviced by accessing the data from the row without requiring an additional activation since the row is still active. Therefore, this response 364-2 may decrease the amount of additional row activations experienced over a period of time. As such, the response 364-2 may be initiated by the RHM 315 by issuing a command to keep the row open beyond when a request associated with a row activation directed to the row is executed. The example event 360-2, threshold 362-2, and/or response 364-2 relationship is a non-limiting example provided for illustrative purposes. Other combinations of and/or relationships between events, thresholds, responses and/or combinations thereof are contemplated for the response table 358.

Another example of a response 364-3 may include slowing the speed and/or rate of row activations to the row having crossed a corresponding row activation threshold quantity. For example, pending access requests may be stored in a queue at the memory controller awaiting execution. The row hammer mitigator 315 may cause a present request and/or future requests to a row, having met or exceeded a threshold (e.g., 362-3), to be reprioritized within the queue such that their execution is delayed. For example, the row hammer mitigator 315 may cause the present request and/or future requests to the row to be deprioritized by appending a timestamp to the requests with an instruction to delay executing the request until a certain amount of time has elapsed as indicated by the timestamp. By delaying the rate of request execution for the row the response 364-3 has de facto delayed the accompanying row activations and rendered the system such that fewer row activations are able to be executed within a same time period. As such, this response 364-3 may reduce the probability of reaching an RHT as the potential frequency of activations necessary to achieve the RHT are reduced. As such, the response 364-3 may be initiated by the RHM 315 by deprioritizing a request associated with a row activation directed to the row by time stamping the request in an execution queue and preventing its execution until an amount of time has elapsed. The example event 360-3, threshold 362-3, and/or response 364-3 relationship is a non-limiting example provided for illustrative purposes. Other combinations of and/or relationships between events, thresholds, responses and/or combinations thereof are contemplated for the response table 358.

Yet another example of a response 364-4 may include triggering an error detection and correction (EDAC) scrub of the threshold-crossing repeatedly accessed row, the neighboring rows, the entire bank, and/or the entire memory device. For example, a system may periodically perform an EDAC scrub of data as a matter of regular operating course. An EDAC scrub may include checking the data for errors and reconstructing the original data where necessary (e.g., where the data identified as corrupted). The EDAC scrub may, for example, systematically check stored data for accuracy utilizing check bits or parity bits for confirmation of accuracy. The EDAC scrub can involve refreshing the data in the rows. The EDAC scrub may, as mentioned above, be scheduled for periodic execution. However, the scheduled EDAC scrubs may be scheduled for times outside of the time windows involved in the row hammer events being detected in the current system. Since an RHT is reached by achieving an amount of activations over a period of time since a previous refresh, the RHM 315 may reduce the probability of repeated accesses reaching or exceeding the RHT or causing further data corruption by introducing or triggering an unscheduled EDAC scrub to refresh the affected victims of a targeted row that has met or exceeded a triggering threshold to restore any data stored therein. As such, the response 364-4 may be initiated by the RHM 315 by initiating an error detection and correction scrub of the memory devices. The example event 360-4, threshold 362-4, and/or response 364-4 relationship is a non-limiting example provided for illustrative purposes. Other combinations of and/or relationships between events, thresholds, responses and/or combinations thereof are contemplated for the response table 358.

In another example of a response 364-5, the RHM 315 may trigger a targeted refresh of the row being repeatedly accessed to the point of crossing the threshold 362-5 and/or a targeted refresh of that row's neighboring rows being subject to the row hammer effect. For example, the row hammer mitigator 315 may issue a command to refresh the row and/or the neighboring rows of the row being repeatedly accessed. By causing the refresh specifically targeting the row and/or its neighbors, the response 364-5 may reduce the probability of repeated accesses reaching or exceeding the RHT or causing further data corruption since the quantity of activations required to reach the RHT is effectively reset by the refresh. As such, the response 364-5 may be initiated by the RHM 315 by issuing a targeted refresh command to initiate a refresh of neighboring rows vulnerable to data corruption by a row hammer attack to the row. The example event 360-5, threshold 362-5, and/or response 364-5 relationship is a non-limiting example provided for illustrative purposes. Other combinations of and/or relationships between events, thresholds, responses and/or combinations thereof are contemplated for the response table 358.

In addition, an event definition (e.g., 360-6) in the response table 358 may include an aggregate row activation ("AGGREGATE ROW ACT"). That is, detection of a row activation may trigger a comparison of an aggregate quantity of row activations across a group of rows to an aggregate threshold quantity of row activations 362-6. For example, the row activation command 350 for a particular row may be detected and the row activation counter for that row may be incremented to reflect its detection. Then, the total quantity of row activations for that row since the last refresh, as indicated by the incremented counter, may be included in a data set including the total quantity of row activations across a plurality of rows. This more comprehensive data set may be compared 352 to an aggregate threshold 362-6 corresponding to row activation counts across a plurality of rows. For examples, the thresholds 362-6 may include proportions of a plurality of rows (e.g., ¼ of the plurality of rows, ½ of the plurality of rows, ⅔, ¾ of the plurality of rows, all of the plurality of rows, etc.) having reached an RHC (e.g., ¼ of a quantity of activations defined as an RHT, ½ of a quantity of activations defined as an RHT, ⅔ of a quantity of activations defined as an RHT, ¾ of a quantity of activations defined as an RHT, the entire quantity of activations defined as an RHT, etc.) that when met and/or exceeded are to trigger a corresponding response 364-6. The response 364-6 may include row hammer mitigation responses to mitigate and prevent additional row activations contributing to the row hammer effect on a row.

For example, if ¼ or more of a plurality of rows being monitored meets or exceeds ½ of a quantity of activations defines as the RHT, a row hammer mitigation response 364-6 applicable to the entire plurality and/or just the effected plurality of rows may be triggered. For example, the RHM 315 may increase the refresh rate for the entire plurality and/or just the effected plurality of rows. Increasing the refresh rate may include decreasing an amount of time that elapses between consecutive refreshes of the rows. For example, if a row refresh rate for the plurality of rows is reduced from every sixty milliseconds to every thirty milliseconds, the probability of experiencing or intensifying a row hammer effect at the rows has been cut in half since the RHT is a measure of activations over a period of time since a previous refresh. Therefore, in order to achieve a same row hammer effect a row hammer attack would need to double the rate of activations to reach the RHT since the time over which the RHT attack can unfold is effectively halved by the response 364-6. As such, the response 364-6 may be initiated by the RHM 315 by reducing a period of time between refreshes of the memory devices. The example event 360-6, threshold 362-6, and/or response 364-6 relationship is a non-limiting example provided for illustrative purposes. Other combinations of and/or relationships between events, thresholds, responses are contemplated for the response table 358.

Moreover, an event definition (e.g., 360-7 . . . 360-M) in the response table 358 may include a number of directed refreshes being performed to the rows over a period of time ("ROW dRFMs PER tREF"). That is, detection of a row activation command 350 and/or the implementation of various responses may trigger a comparison 352 of an amount of directed refreshes (dRFMs) being directed to a repeatedly accessed row and/or its neighboring rows over a reference time period tREF. An increased number of row refreshes over a time period may be indicative of a persistent row hammer attack underway and a persistent performance impacting pattern of responses being issued by the row hammer mitigator 315. When the quantity of refreshes over a time period exceeds a threshold quantity of refreshes over the time period (e.g., 362-7 . . . 362-M), then it may be an indication that an escalation of a response to the row hammer attack may be prudent. As such, the RHM 315 may trigger a first software response 364-7 responsive to the directed refreshes exceeding a first threshold 362-7. The first software response 364-7 may be triggered by, for example, sending a command to a host operating system prompting an operating system response to the activity. If the first software response 364-M fails to reduce the level of refreshes over the time period as evidenced by crossing a second threshold 362-M, then the RHM 315 may send a command to the host operating system to trigger a second more aggressive software response 364-M by the operating system.

The responses 364-1 . . . 364-M may have a performance impact on the memory controller and/or the memory device when initiated. For example, the responses 364-1 . . . 364-M may each consume distinct amounts of time, processing resources, power requirements, etc. that have distinct impacts on the system's operation. The responses 364-1 . . . 364-M may, when executed, cause distinct processing delays resulting in distinct levels of system performance degradation. In some examples, the responses 361-1 . . . 364-M may be paired with triggering thresholds 362-1 . . . 362-M, or RHC, such that meeting or exceeding incrementally higher thresholds trigger responses with incrementally higher performance impacts. That is, as a row hammer attack increases in probability, effect, and/or intensity as indicated by a corresponding increase in the quantity or frequency of, for example, triggering row activations to achieve a threshold, the response paired with the increased triggering threshold may carry with it an increased degradation effect on performance. For example, the higher the threshold amount being exceeded in the response table 358 the more impactful the corresponding indicated response is on the system performance. In this manner, the more severe or larger scale the row hammer attack is detected to be, the more aggressive the indicated response is. Therefore, the response to a row hammer attack may scale with the intensity of the attack as maintaining system performance is initially a priority over thwarting a row hammer attack at lower threshold levels and system performance becomes less of a priority as compared to thwarting the attack as the attack intensifies and/or scales up. For example, in response to a row activation event 360-1 exceeding an RHC of ¼ of the quantity of activations defining an RHT threshold 362-1, a cache priority response 364-1 may be indicated which minimally impacts system performance by adjusting cache usage but would likely be effective at thwarting a low intensity row hammer attack and/or an inadvertent row hammering. In contrast, in response to a row activation event 360-5 exceeding an RHC of the entire quantity of activations defining an RHT threshold 362-5, a target refresh response 362-5 may be indicated that significantly impacts system performance by preventing the rows from being accessed during a refresh which is likely much more effective at thwarting an aggressive row hammer attack.

As described above, the RHM 315 may utilize a comparison 352 between data including the row activation command 350 and the response table 358 to determine whether a quantity of detected events (e.g., row activations, aggregate row activations, directed refreshes of a reference time period, etc.) exceeds a corresponding RHC (e.g., a triggering threshold, a proportion of a quantity defining the RHT, a proportion of a plurality of rows achieving an RHC, a quantity of directed refreshes over a period of time, etc.). In examples where the data including the row activation command 350 does not meet or exceed the RHC triggering thresholds 362-1 . . . 362-M indicated in the response table 358, the RHM 315 may take no action and the row activation command 350 may increment any corresponding counters and be added to a queue for execution as normal.

In examples where the data including the row activation command 350 does meet or exceed the RHC triggering thresholds 362-1 . . . 362-M indicated in the response table 358, the RHM 315 may select a row hammer mitigation response 354 to initiate in order to mitigate an increased row hammer probability. The RHM 315 may select a row hammer mitigation response 354 from among a plurality of responses 364-1 . . . 364-M available to the RHM 315 and/or memory controller. The selected row hammer mitigation response may be the row hammer mitigation response indicated to be triggered by the response table 358. In some examples, the RHM 315 may select more than one row hammer mitigation response. In some examples, the RHM 315 may select a row hammer mitigation response or responses indicated in the response table 358 as having the highest exceeded RHC triggering thresholds 362-1 . . . 362-M.

The RHM 315 may initiate the selected row hammer response 356. Initiating the selected row hammer mitigation response 356 may include sending a command to a portion of the computing system that will implement the row hammer mitigation measure. For example, the RHM 315 may initiate the selected row hammer mitigation response 356 by sending a command to one or more of a host system, a system on a chip (SoC) controller, a channel controller, a bank controller, the memory device, etc. which will execute the command to implement the selected row hammer mitigation measure.

Figure 4:
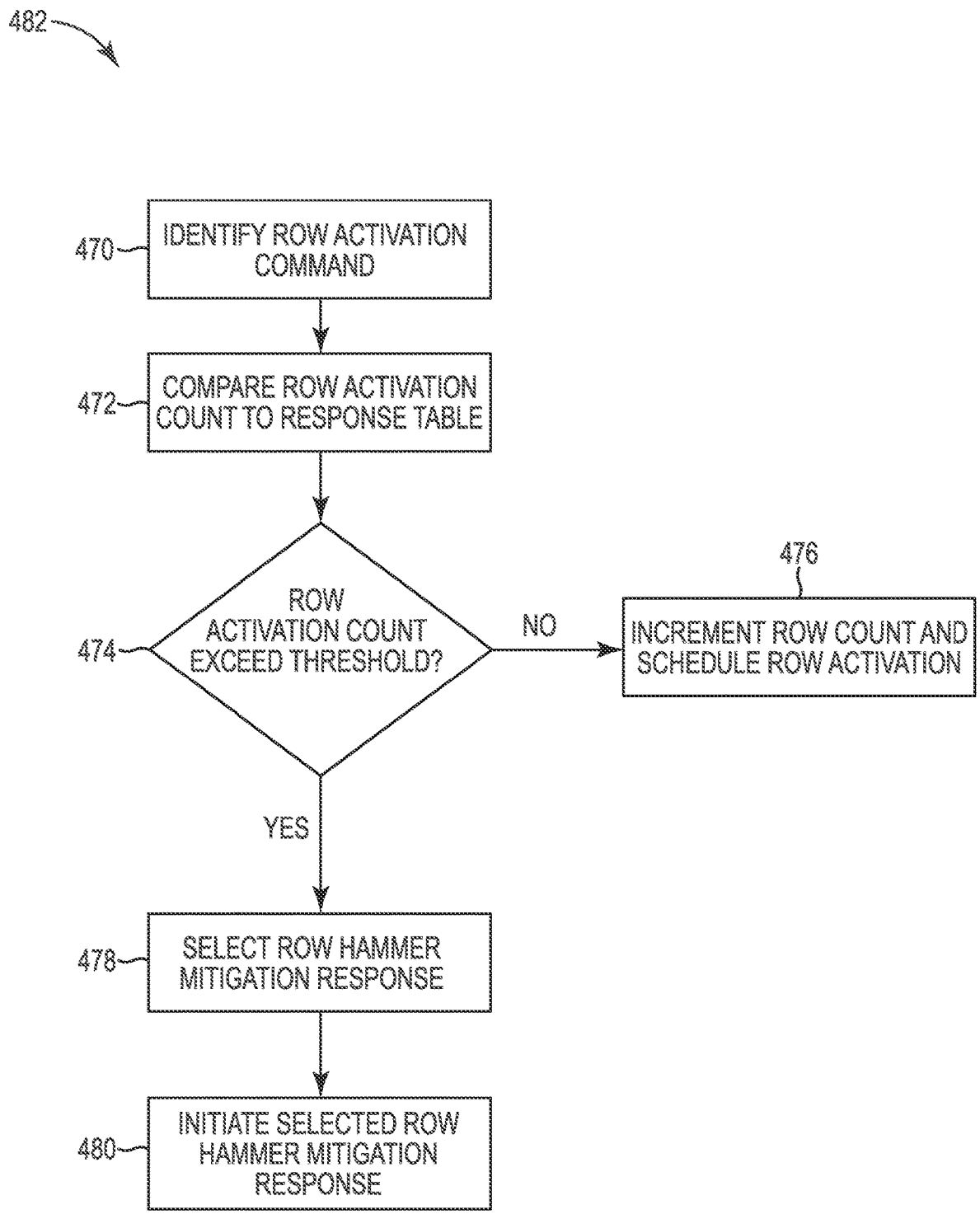
FIG. 4 is a functional flow diagram of a number of embodiments of the present disclosure.

FIG. 4 is a functional flow diagram 482 of a number of embodiments of the present disclosure. At 470 a row activation command may be received. As described above, a row activation command may be transmitted to and/or intercepted by a controller such as a central controller (e.g., central controller 210 as illustrated in FIG. 2). The row activation command may be received once a cache miss has occurred establishing that data associated with an access request is not stored in a cache and must be retrieved from a row by activating the row.

At 472 a row activation count may be compared to a response table. The row activation count may include a count of row activations occurring since a prior refresh which are stored in a row activation counter that is incremented each time its corresponding row is activated since a previous refresh. Specifically, the row activation counter may include a count of row activations, since a last refresh, for the row or rows that are the subject of the identified row activation command from 470.

The response table may include a data structure storing triggering events, RHC threshold count quantities corresponding to the triggering events, and/or recommended row mitigation measures corresponding to the threshold counts. For example, the response table may provide a recommendation of which row mitigation measure or measures of a plurality of row mitigation measures available for initiation by the memory controller should be applied at each of a plurality of count thresholds.

Comparing the row activation count to the response table may include comparing the quantity of row activations stored in a row activation counter to the response table. In some examples, comparing the row activation count may include comparing the row activation count including the newly identified row activation command despite not having executed the newly identified activation command yet. In some examples, the row activation count that is to be compared may not include the newly identified row activation command. In some examples, the row activation count may include a row activation count of the same row that is the subject of the identified row activation command and/or its neighboring rows that are subject to a row hammer effect. In some examples, the row activation count may include a row activation count of a plurality of rows in a memory device including the row that is the subject of the identified row activation command and/or its neighboring rows. Comparing the row activation count to the response table may include comparing the row activation count to threshold counts specified in the response table.

At 474 a determination may be made as to whether, based on the comparison of 472, the row activation count meets or exceeds a threshold account specified in the response table. For example, a determination may be made as to whether the row activation count exceeds an RHC such as a specific proportion of a quantity of row activations defining an RHT as identified in the response table. In an example, a determination may be made as to whether a row activation count for a particular row targeted to be activated by the identified row activation command meets or exceeds ¼ of the quantity of row activations comprising the RHT for the row.

If it is determined that the row activation count does not exceed a threshold (e.g., "NO"), then at 476 the identified activation command may be scheduled for execution. For example, the access request associated with the identified row activation command may be added to an execution queue for execution and/or executed by a memory controller to activate the row and retrieve the data from the row. In addition, a counter for the row activation count of the row being activated may be incremented to reflect an execution of the row activation.

If it is determined that the row activation count does exceed a threshold (e.g., "YES"), then at 478 a row hammer mitigation response may be selected. The row hammer mitigation response may be an action that, when executed, reduces the probability of a successful row hammer attack and/or additional row hammer effects being experienced by neighboring rows of a row being repeatedly activated. The row hammer mitigation response may be selected from among a plurality of distinct row hammer mitigation responses available to the memory controller. The plurality of row hammer mitigation responses may include distinct responses that are respectively associated with distinct impacts on the performance on the operation of the memory devices and their controllers. For example, the row hammer mitigation responses may be associated with various degradations and/or delays to satisfying data access requests at the memory devices.

The particular row hammer mitigation response selected may be the row hammer mitigation response indicated by the response table as corresponding with the exceeded threshold indicated in the response table. In some examples, the particular row hammer mitigation response selected may be the row hammer response that corresponds to the severity and/or scale of a suspected row hammer attack as indicated by the magnitude of the row count threshold having been exceeded by the row activation count. The more severe the suspected row hammer attack and/or the greater the scale of the suspect row hammer attack, the more of a negative impact on performance the selected row hammer mitigation response may have since those more impactful responses may be more aggressive and more effective at thwarting a row hammer attack.

At 480, the selected hammer mitigation response may be initiated. Initiating the selected row hammer mitigation response may include sending a command to one or more components of the memory device, memory controller, host device, SoC controller, etc. in order to initiate the execution of the response.

Figure 5:
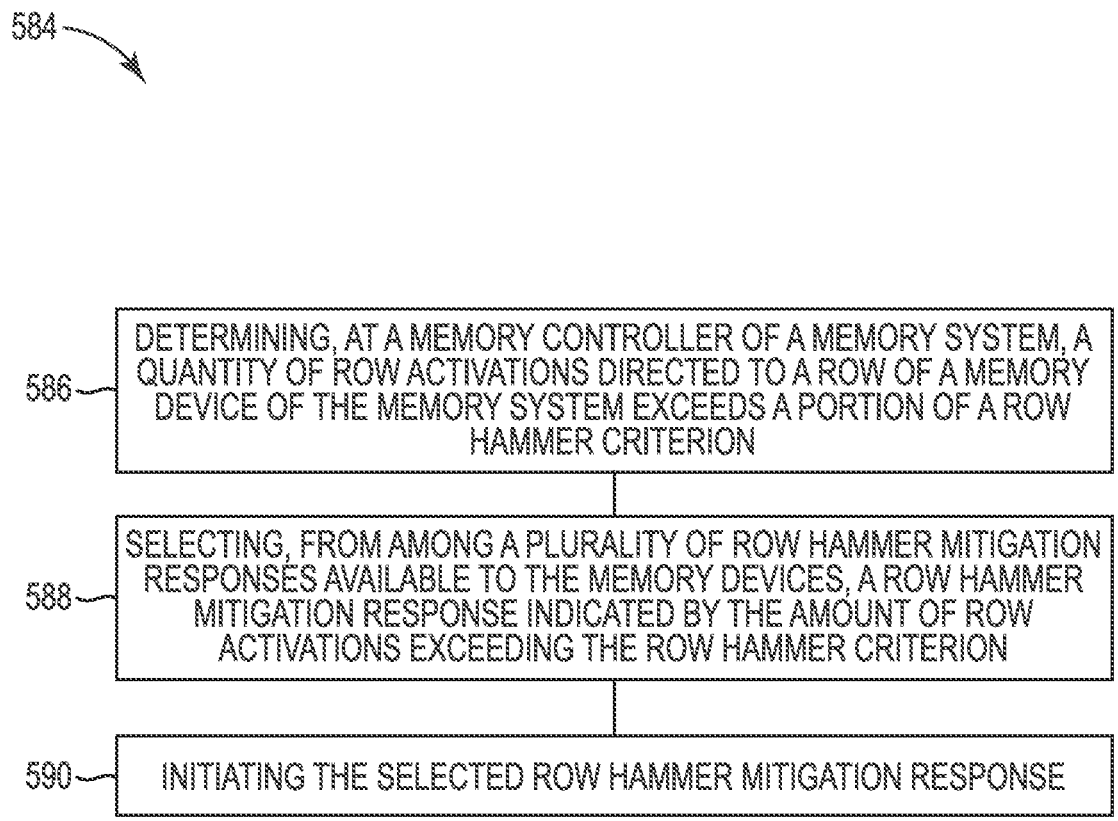
FIG. 5 is a flow diagram of a method for selectable row hammer mitigation in accordance with a number of embodiments of the present disclosure.

FIG. 5 is a flow diagram of a method 584 for selectable row hammer mitigation in accordance with a number of embodiments of the present disclosure. The methods described herein (e.g., with respect to FIG. 5) can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 586 the method 584 can include determining, at a memory controller of a memory system, that a quantity of row activations directed to a row of a memory device of the memory system exceeds an RHC. As described above, the determination may be accomplished by comparing a row activation count for a row or rows of a memory device to a response table specifying row activation count thresholds (e.g., RHCs) defined as proportions of a quantity of row activations comprising an RHT. In some examples, the comparison may be performed in response to intercepting a row activation command at the memory controller.

At 588 the method 584 can include selecting a row hammer mitigation response. The row hammer mitigation response may be selected from among a plurality of row hammer mitigation responses available for initiation by the memory controller. That is, the memory controller may have a plurality of row hammer mitigation responses from which to select in order to address suspected row hammer activity.

The row hammer mitigation response may be selected from among the plurality of selectable row hammer mitigation responses on the basis of the previously described determination that the quantity of row activations exceeds an RHC. For example, a response table as described above may be utilized. The response table may provide a correlation between a plurality of RHCs and respective corresponding row hammer mitigation responses indicated for initiation in response to meeting, exceeding, and/or being about to exceed the corresponding RHC. As such, a row hammer mitigation response from among the plurality of available row hammer mitigation responses may be selected based on the row hammer mitigation response being indicated by the quantity of row activations meeting, exceeding, and/or being about to exceed the corresponding RHC. In some examples, a highest RHC met, exceeded, or about to be exceeded by a row activation count may be associated with an indicated row hammer mitigation response in the response table, and that indicated row hammer mitigation response may be selected on the basis of the row activation count exceeding at least that highest RHC.

At 590 the method 584 may include initiating the selected row hammer mitigation response. Initiating the selected row hammer mitigation response may include prioritizing holding of data, returned from a request associated with a row activation directed to the row, in a cache, the data in the cache being accessible to satisfy subsequent requests for the data instead of by activating the row.

Initiating the selected row hammer mitigation response may include deprioritizing requests associated with a row activation directed to the row. That is, the execution requests associated with activating a row being repeatedly accessed may be deprioritized by time stamping the request in an execution queue and preventing the execution of the request until an amount of time has elapsed.

Initiating the selected row hammer mitigation response may include holding an activated row open. For example, initiating the row hammer mitigation response may include keeping an activated row in an open activated state beyond when a request associated with a row activation directed to the row has its execution completed. By keeping the row open beyond when it would otherwise be closed an additional activation may be avoided in the event of another request for data in the row.

Initiating the selected row hammer mitigation response may include issuing a targeted refresh command. A targeted refresh command may include a command that initiates a refresh targeting at least the rows neighboring a repeatedly accessed row. For example, the target refresh may cause a refresh of neighboring rows vulnerable to data corruption by a row hammer attack.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
a number of memory devices; and
a memory controller coupled to the number of memory devices, the memory controller configured to:
determine, based on a quantity of row activations directed to a row of the number of memory devices, that a row hammer criterion, of a plurality of different row hammer criteria, is met, wherein each of the plurality of different row hammer criteria is defined by a different proportion of a quantity of row activations defining a row hammer threshold (RHT);

responsive to determining that the row hammer criterion is met:
  select a row hammer mitigation response from a plurality of row hammer mitigation responses available for initiation based on a scale of a suspected row hammer attack corresponding to the row hammer criterion; and
  initiate the selected row hammer mitigation response.

2. The apparatus of claim 1, wherein each of the plurality of row hammer criteria correspond to respective different scales of a suspected row hammer attack.

3. The apparatus of claim 2, wherein each of the plurality of row hammer criteria is associated with a respective row hammer mitigation response of the plurality of row hammer mitigation responses available for initiation by the memory controller, and wherein a magnitude of a performance impact imposed by each of the plurality of row hammer mitigation responses on the apparatus is matched to the scale of the suspected row hammer attack.

4. The apparatus of claim 1, wherein the memory controller further comprises a central controller, a channel controller, a bank controller, or combinations thereof.

5. The apparatus of claim 4, wherein the memory controller is configured to initiate the selected row hammer mitigation response by issuing a command from the central controller, the channel controller, the bank controller, or combinations thereof.

6. The apparatus of claim 1, wherein the memory controller is configured to determine whether the quantity of row activations directed to the row of the memory devices exceeded the row hammer criterion by referencing an activation counter for the row, wherein the activation counter is incremented each time an activation of the row is initiated.

7. The apparatus of claim 6, wherein a quantity of row activations counted in the activation counter is reset each time the row is refreshed.

8. The apparatus of claim 1, wherein the memory controller is configured to determine whether the quantity of row activations directed to the row of the memory devices meets the row hammer criterion responsive to intercepting a row activation command directed to the row of the memory devices.

9. The apparatus of claim 1, wherein the memory controller is configured to select, based on the quantity of row activations meeting a second row hammer criterion, a second row hammer mitigation response from the plurality of row hammer mitigation responses available for initiation by the memory controller.

10. The apparatus of claim 9, wherein the second row hammer criterion is a greater quantity than row hammer criterion and wherein the second row hammer mitigation response imposes a greater impact on a performance of the apparatus.

11. A method, comprising:
  determining, at a memory controller of a memory system, a quantity of row activations directed to a row of a memory device of the memory system exceeds a row hammer criterion of a plurality of different row hammer criteria, wherein each of the plurality of different row hammer criteria is defined by a different proportion of a quantity of row activations defining a row hammer threshold (RHT);
  selecting, from among a plurality of row hammer mitigation responses available to the memory devices, a row hammer mitigation response indicated by the quantity of row activations exceeding the row hammer criterion and based on a scale of a suspected row hammer attack corresponding to the row hammer criterion; and
  initiating the selected row hammer mitigation response.

12. The method of claim 11, further comprising initiating the row hammer mitigation response by prioritizing holding of data, returned from a request associated with a row activation directed to the row, in a cache accessible to satisfy subsequent requests for the data instead of by activating the row.

13. The method of claim 11, further comprising initiating the row hammer mitigation response by deprioritizing a request associated with a row activation directed to the row by time stamping the request in an execution queue and preventing its execution until a quantity of time has elapsed.

14. The method of claim 11, further comprising initiating the row hammer mitigation response by keeping the row open beyond when a request associated with a row activation directed to the row is executed.

15. The method of claim 11, further comprising initiating the row hammer mitigation response by issuing a targeted refresh command to initiate a refresh of neighboring rows vulnerable to data corruption by a row hammer attack to the row.

16. An apparatus, comprising:
  a number of memory devices; and
  a memory controller coupled to one or more of the number of memory devices, the memory controller configured to:
  monitor a quantity of row activations directed to a plurality of rows of the memory devices;
  select a first row hammer mitigation response, from among a plurality of row hammer mitigation responses available to the memory controller, responsive to an aggregate quantity of row activations directed to the plurality of rows of the memory devices exceeding a first threshold amount of activations, of a plurality of different threshold amounts of activations, since a last refresh of the plurality of rows, wherein each of the plurality of different threshold amounts of activations is defined by a different proportion of a quantity of row activations defining a row hammer threshold (RHT), and wherein the first row hammer mitigation response is selected based on a scale of a suspected row hammer attack corresponding to the first threshold amount of activations; and
  select a second row hammer mitigation response from among the plurality of row hammer mitigation responses available to the memory controller, responsive to the aggregate quantity of row activations directed to the plurality of rows of the memory devices exceeding a second threshold amount of activations, of the plurality of different threshold amounts of activations, since the last refresh of the plurality of rows, wherein the second row hammer mitigation response is selected based on a scale of a suspected row hammer attack corresponding to the second threshold amount of activations.

17. The apparatus of claim 16, wherein the controller is configured to initiate the first row hammer mitigation response by sending a command to a host to initiate the first row hammer mitigation response at the host.

18. The apparatus of claim 16, wherein the controller is configured to initiate the first row hammer mitigation response by reducing a period of time between refreshes of the memory devices.

19. The apparatus of claim 16, wherein the controller is configured to select the second row hammer mitigation response additionally responsive to an execution of the first row hammer mitigation response failing to prevent the aggregate quantity of row activations from exceeding the second threshold amount of row activations since the last refresh of the plurality of rows.

20. The apparatus of claim 19, wherein the controller is configured to initiate the second row hammer mitigation response by initiating an error detection and correction scrub of the memory devices.

* * * * *